(12) United States Patent
Kornilovich et al.

(10) Patent No.: US 7,847,368 B2
(45) Date of Patent: Dec. 7, 2010

(54) MULTILAYER FILM WITH STACK OF NANOMETER-SCALE THICKNESSES

(75) Inventors: Paval Kornilovich, Corvallis, OR (US); Peter Mardilovich, Corvallis, OR (US); Sriram Ramamoorthi, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/104,252

(22) Filed: Apr. 16, 2008

(65) Prior Publication Data

US 2009/0126977 A1   May 21, 2009

Related U.S. Application Data

(62) Division of application No. 11/068,363, filed on Feb. 28, 2005, now Pat. No. 7,375,012.

(51) Int. Cl.
 *H01L 29/00* (2006.01)
(52) U.S. Cl. .............. 257/508; 257/211; 438/128; 438/598; 438/623; 977/932
(58) Field of Classification Search ........... 257/211, 257/508; 438/128, 598, 623; 977/932
See application file for complete search history.

(56) References Cited

U.S. PATENT DOCUMENTS

| | | | |
|---|---|---|---|
| 2,744,970 A | 5/1956 | Shockley | |
| 2,939,057 A | 5/1960 | Teszner | |
| 3,964,296 A | 6/1976 | Matzuk | |
| 4,633,284 A * | 12/1986 | Hansell et al. | 257/58 |
| 5,008,616 A | 4/1991 | Lauks et al. | |
| 5,118,801 A | 6/1992 | Lizardi et al. | |
| 5,132,278 A | 7/1992 | Stevens et al. | |
| 5,202,290 A | 4/1993 | Moskovits | |
| 5,237,523 A | 8/1993 | Bonne et al. | |
| 5,330,612 A | 7/1994 | Watanabe | |
| 5,376,755 A | 12/1994 | Negm et al. | |
| 5,418,558 A | 5/1995 | Hock et al. | |
| 5,493,167 A | 2/1996 | Mikol et al. | |
| 5,591,896 A | 1/1997 | Lin | |
| 5,622,825 A | 4/1997 | Law et al. | |
| 5,747,180 A | 5/1998 | Miller et al. | |
| 5,767,521 A | 6/1998 | Takeno et al. | |
| 5,772,905 A | 6/1998 | Chou | |
| 5,780,710 A | 7/1998 | Murase et al. | |
| 5,801,124 A | 9/1998 | Gamble et al. | |
| 5,837,454 A | 11/1998 | Cozzette et al. | |
| 5,837,466 A | 11/1998 | Lane et al. | |
| 5,843,653 A | 12/1998 | Gold et al. | |
| 5,869,244 A | 2/1999 | Martin et al. | |
| 5,918,110 A | 6/1999 | Abraham-Fuchs et al. | |
| 5,972,710 A | 10/1999 | Weigl et al. | |
| 5,997,958 A | 12/1999 | Sato et al. | |
| 6,034,389 A | 3/2000 | Burns, Jr. et al. | |

(Continued)

OTHER PUBLICATIONS

"Ultrahigh-Density Nanowire Lattices and Circuits" California Nanosystems Institute University of California Sciencexpress Report Sciencexpress/www sciencexpress org/13March2003/10 1126/science 1081940 pp. 1-4.

(Continued)

*Primary Examiner*—Thanh V Pham (57) ABSTRACT

This disclosure describes system(s) and/or method(s) enabling contacts for individual nanometer-scale-thickness layers of a multilayer film.

19 Claims, 8 Drawing Sheets

U.S. PATENT DOCUMENTS

| | | | |
|---|---|---|---|
| 6,085,413 | A | 7/2000 | Klassen et al. |
| 6,120,844 | A | 9/2000 | Chen et al. |
| 6,150,097 | A | 11/2000 | Tyagi et al. |
| 6,150,106 | A | 11/2000 | Martin et al. |
| 6,214,631 | B1 | 4/2001 | Burrows et al. |
| 6,231,744 | B1 | 5/2001 | Ying et al. |
| 6,238,085 | B1 | 5/2001 | Higashi et al. |
| 6,256,767 | B1 | 7/2001 | Kuekes et al. |
| 6,284,979 | B1 | 9/2001 | Malozemoff et al. |
| 6,294,450 | B1 | 9/2001 | Chen et al. |
| 6,331,680 | B1 | 12/2001 | Klassen et al. |
| 6,355,436 | B1 | 3/2002 | Martin et al. |
| 6,359,288 | B1 | 3/2002 | Ying et al. |
| 6,360,582 | B1 | 3/2002 | Chelvayohan et al. |
| 6,365,059 | B1 | 4/2002 | Pechenik |
| 6,407,443 | B2 | 6/2002 | Chen et al. |
| 6,438,501 | B1 | 8/2002 | Szecsody et al. |
| 6,463,124 | B1 | 10/2002 | Weisman et al. |
| 6,482,639 | B2 | 11/2002 | Snow et al. |
| 6,521,109 | B1 | 2/2003 | Bartic et al. |
| 6,562,577 | B2 | 5/2003 | Martin et al. |
| 6,643,491 | B2 | 11/2003 | Kinouchi et al. |
| 6,656,275 | B2 | 12/2003 | Iwamoto |
| 6,680,377 | B1 | 1/2004 | Stanton et al. |
| 6,694,800 | B2 | 2/2004 | Weckstrom et al. |
| 6,747,180 | B2 | 6/2004 | Ostgard et al. |
| 7,304,412 | B2 * | 12/2007 | Philliber ............... 310/324 |
| 7,434,512 | B2 * | 10/2008 | Bietsch et al. ............. 101/483 |
| 2001/0036721 | A1 | 11/2001 | Dallner et al. |
| 2001/0046674 | A1 | 11/2001 | Ellington |
| 2002/0012937 | A1 | 1/2002 | Tender |
| 2002/0061536 | A1 | 5/2002 | Martin |
| 2002/0117659 | A1 | 8/2002 | Lieber et al. |
| 2002/0130353 | A1 | 9/2002 | Lieber et al. |
| 2002/0175408 | A1 | 11/2002 | Majumdar et al. |
| 2003/0089899 | A1 | 5/2003 | Lieber et al. |
| 2003/0121791 | A1 | 7/2003 | Cohen |
| 2003/0132461 | A1 | 7/2003 | Roesner et al. |
| 2003/0148562 | A1 | 8/2003 | Luyken et al. |
| 2003/0162190 | A1 | 8/2003 | Gorenstein |
| 2003/0170650 | A1 | 9/2003 | Karube et al. |
| 2003/0183008 | A1 | 10/2003 | Bang et al. |
| 2003/0186522 | A1 | 10/2003 | Duan et al. |
| 2003/0189202 | A1 | 10/2003 | Li et al. |
| 2003/0219801 | A1 | 11/2003 | Lipshutz |
| 2003/0224435 | A1 | 12/2003 | Seiwert |
| 2004/0005723 | A1 | 1/2004 | Empedocles et al. |
| 2004/0005923 | A1 | 1/2004 | Allard |
| 2004/0007740 | A1 | 1/2004 | Abstreiter et al. |
| 2004/0009510 | A1 | 1/2004 | Seiwert et al. |
| 2004/0028936 | A1 | 2/2004 | Kogiso et al. |
| 2004/0031975 | A1 | 2/2004 | Kern et al. |
| 2004/0043527 | A1 | 3/2004 | Bradley et al. |
| 2004/0061234 | A1 | 4/2004 | Shah et al. |
| 2004/0134772 | A1 | 7/2004 | Cohen et al. |

OTHER PUBLICATIONS

"Sublighographic nanofabrication technology for nanocatalysts and DNA Chips"; J. Vac. Sci. Technol. B21 (6) Nov./Dec. 2003; pp. 2951-2955.

"Percolation-dominated conductivity in a conjugated-polymer-carbon composite" Rapid communications Physical Review B vol. 58 No. 12 Sep. 15, 1998 The American Physical Society pp. RR7492-R7495.

"A polymer gate FET sensor array for detecting organic vapours" Sensors and Actuators B 77 Elsevier Science 2001 pp. 155-162.

* cited by examiner

MULTILAYER FILM WITH STACK OF NANOMETER-SCALE THICKNESSES

CROSS-REFERENCE TO RELATED APPLICATIONS

This application is a divisional of commonly assigned application Ser. No. 11/068,363, filed on Feb. 28, 2005, now granted U.S. Pat. No. 7,375,012, the entire disclosure which is incorporated herein by reference.

TECHNICAL FIELD

This invention relates to contacts for multilayer films.

BACKGROUND

Multilayer films having nanometer-scale-thickness layers (i.e., layers having a thickness between about one to about 100 nanometers) may be used in many advantageous ways. Some of these films have multiple conductive layers separated by insulative layers. To enable some advantageous uses for these types of multilayer films, the multiple conductive layers may be placed in electrical communication. This electrical communication may be to a computer, such as for informational uses like using a multilayer film as a sensor or in a computing system. This electrical communication may also be to a higher-power source, such as for processing of the multilayer film.

One way in which to enable electrical communication with multiple conductive layers of a nanometer-scale-thickness multilayer film is to expose the layers, such as with a cross-section of the multilayer film, and make an electrical contact to the exposed cross-section. This electrical contact, however, may enable electrical communication with multiple—rather than individual—conductive layers. In part because of the thickness of the layers, this way in which to enable electrical communication may be impracticable or impossible to use to enable electrical communication with individual conductive layers.

BRIEF DESCRIPTION OF THE DRAWINGS

The same numbers are used throughout the disclosure and figures to reference like components and features.

DETAILED DESCRIPTION

Overview

This document describes system(s) and/or method(s) ("tools") enabling large-scale contacts for individual nanometer-scale-thickness layers of a multilayer film.

In one embodiment, the described tools are used to fabricate contacts having exposed dimensions both of which are one or more orders of magnitude larger than a thickness of individual nanometer-scale-thickness layers of a multilayer film to which each enables electrical communication. The described tools also may be used to fabricate, in another embodiment, contacts enabling connection to individual nanometer-scale-thickness layers of a multilayer film where the contacts are separated by at least a micrometer. In still another embodiment, the described tools are used to fabricate large-scale contacts for individual nanometer-scale-thickness layers of a multilayer film using a single mask having one or more protrusions.

Shadow Effect

Often when applying a thin film using a mask, the mask is placed very close to or touching a surface on which the thin film is to be applied. See, for example, FIG. 1. A cross-sectional view of a material 100 applied over a surface 102 of a substrate 104 is shown. Note that the material covers the surface corresponding to the size of an opening 106 of a mask 108. One reason for placing the mask very close to or touching the surface is to reduce a shadow effect.

Figure 1:
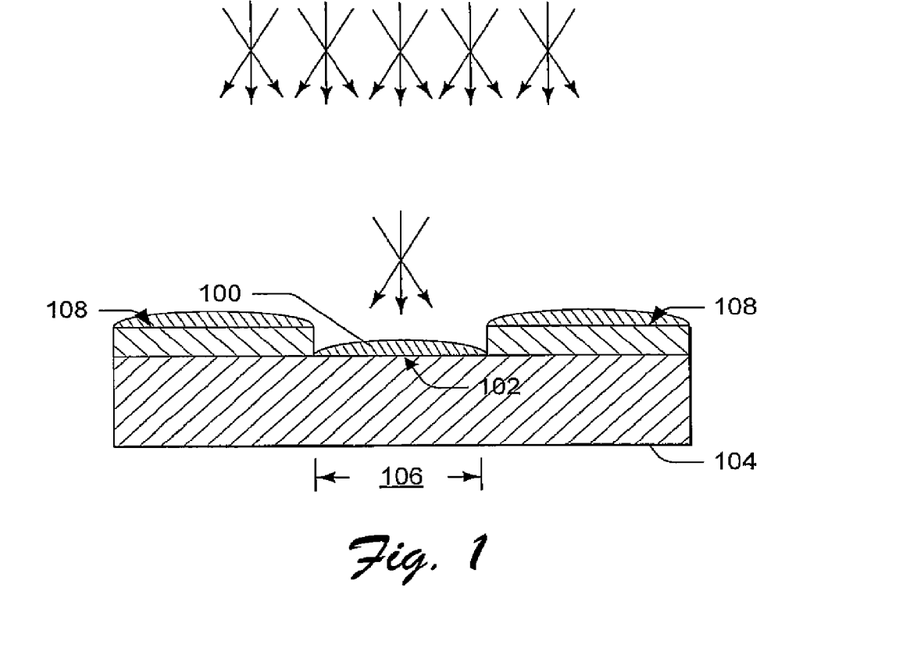
FIG. 1 illustrates a cross-sectional view of a material applied over a surface of a substrate through a mask.
Figure 2:
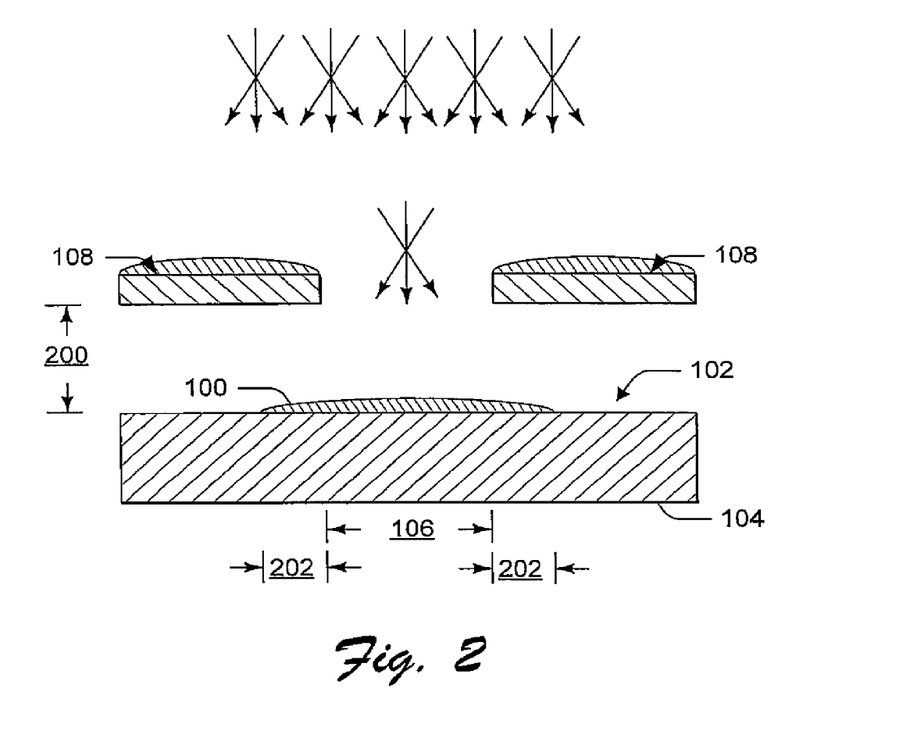
FIG. 2 illustrates a cross-sectional view of a material applied over a surface of a substrate through a mask at an application distance with the applied material demonstrating a shadow effect.

Conversely, consider FIG. 2. Here an exemplary shadow effect is shown. The same mask, material, process of applying the material, and surface shown in FIG. 1 are shown in FIG. 2. The difference is that mask 108 is oriented a distance 200 from surface 102 of the substrate. This application distance is parallel to the direction of application and causes the material to reside outside opening 106 of the mask. The shadow effect, in this example, is the distance 202 outside of the opening 106. The applied material residing outside opening 106 resides on part of surface 102 over which the mask is oriented during application of the material. Thus, the area of surface 102 where the material is not applied may be smaller than the area of the mask.

A shadow effect's magnitude depends on the deposition conditions, such as the material being deposited and how it is deposited. It also depends on the application distance between the mask and the surface on which the material is deposited. Thus, if the deposition conditions are kept constant, the magnitude of the shadow effect may be calculable based on the application distance. The shadow effect's magnitude for particular application distances may also be experimentally determined.

In one experiment, gold was sputtered over a masked $SiO_2$ (1.7 µm)/Si substrate having a tantalum adhesion layer on its surface. The tantalum adhesion layer was sputtered on the substrate and not exposed to air prior to applying the gold. The opening in the mask was 150 microns. Without an application distance (the mask touching the tantalum adhesion layer), the gold was deposited to a width of 150 microns—the same as the size of the opening in the mask. With an application distance of 150 microns, the gold was deposited to a width of 240 microns. Thus, the shadow effect's magnitude for this application distance is 45 microns (see, for illustration, distance 202 of FIG. 2). With an even larger application distance of 700 microns, the gold was deposited to a width of 650 microns. The shadow effect's magnitude for this application distance is 250 microns.

Building Large-Scale Contacts

Exemplary ways in which the tools may be used to fabricate large-scale contacts for individual nanometer-scale-thickness layers of a multilayer film are set forth below. In an exemplary illustrated embodiment, the tools use a single mask having one or more protrusions to create these large-scale contacts. In the following illustrated embodiment, the tools orient the mask's position transversely relative to the substrate surface and at varying application distances. These varying application distances can be effective to create a varying shadow effect, which is described below.

Figure 3:
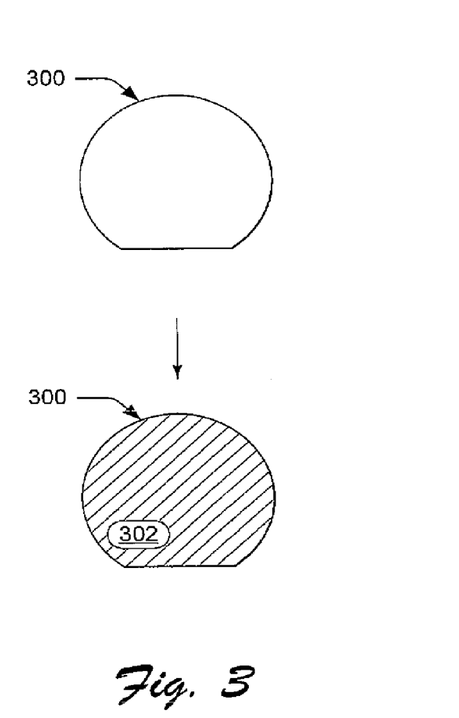
FIG. 3 illustrates an exemplary substrate over which an insulative layer is formed.

Referring initially to FIG. 3, a plan view of an exemplary substrate 300 is provided over which an insulative layer 302 is formed. This substrate may comprise silicon-based wafers (e.g., Si/SiO$_2$ or Si/Si3N$_4$) with or without preliminary fabricated micron-dimensional support structures. This and other insulative layers described herein may comprise various forms and materials, such as forms with multi-layer insulative layers with one or more materials, such as, for example, oxides, nitrides, and carbides, such as silicon dioxide (SiO$_2$), silicon nitride (Si$_3$N$_4$), aluminum oxide (Al$_2$O$_3$), tantalum pentoxide (Ta$_2$O$_5$), hafnium(IV) oxide (HfO$_2$), zirconium (IV) oxide (ZrO$_2$), strontium titanate (ST), barium strontium titanate (BST), lead zirconium titanate (PZT), strontium bismuth tantalate (SBT), bismuth zirconium titanate (BZT), magnesium oxide (MgO), and yttria-stabilized zirconia (YSZ), and may be nanometer-scale in thickness or otherwise.

Figure 4:
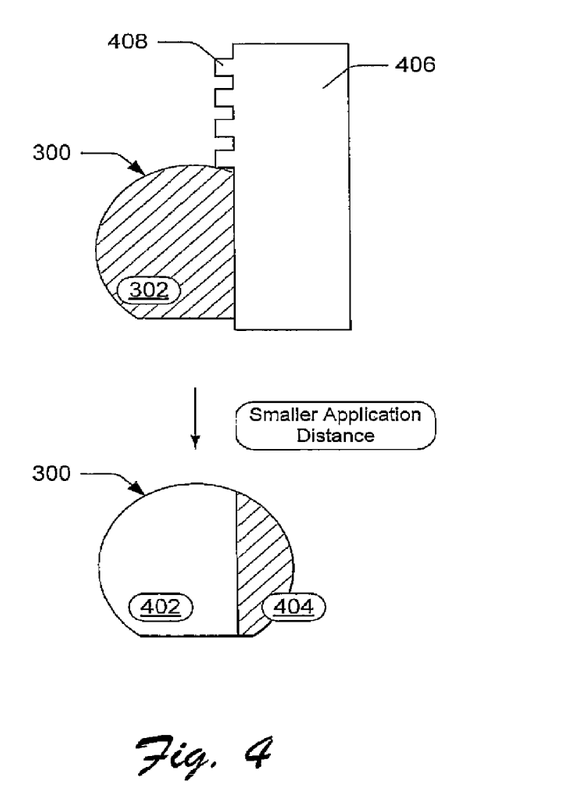
FIG. 4 illustrates the substrate of FIG. 3 after further processing.

Referring to FIG. 4, a conductive layer 402 is applied over the insulative layer and/or the substrate. This conductive layer may be applied effective to leave an insulative contact region 404 over the substrate, such as with an exposed region of layer 302 formed at FIG. 3. This and other layers may be applied in various appropriate manners, such as by sputtering or photolithography (e.g., deposition of a photoresist, exposure, development, and etching).

In the illustrated embodiment, the conductive layer is applied over the substrate and insulative layer 302 covered in part with a mask 406 with one or more protrusions 408. Here, the mask is effective to prohibit the conductive layer from covering the region 404. Also, the mask may have an application distance or be in contact with the insulative layer.

Figure 5:
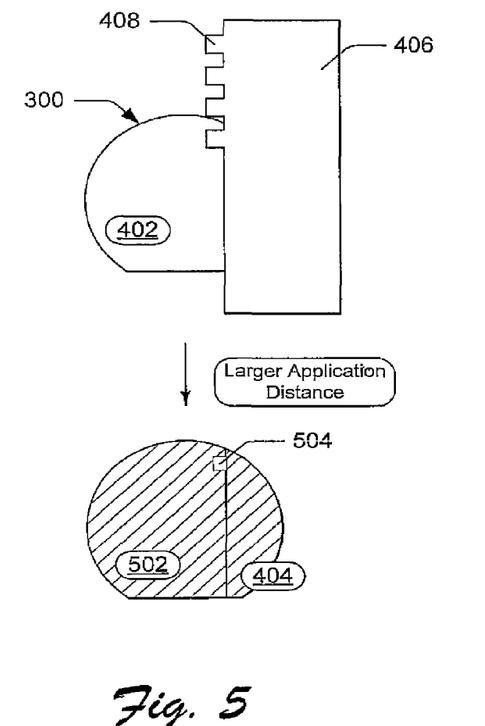
FIG. 5 illustrates the substrate of FIG. 4 after further processing.

Referring to FIG. 5, a nanometer-scale-thickness insulative layer 502 is applied over conductive layer 402 covered in part by the mask and at least one of the protrusions. The protrusion is effective to prevent the insulative layer from being applied over a contact region 504 of the conductive layer but oriented such that a shadow effect causes the contact region to be smaller in area than the protrusion. The contact region's area is related to the area of the protrusion of the mask and an application distance between the protrusion and the surface of conductive layer 402. The contact region's area may have dimensions that are one or more orders of magnitude larger than the thickness of the conductive layer to which it enables electrical communication. If, for example, the thickness of the conductive layer is twenty nanometers, the outer dimensions (e.g., width and length) of the contact region each may be 500 nanometers to five millimeters.

In the illustrated embodiment, the protrusion of the mask is a square having a width and length of 150 microns, though many other shapes and dimensions may also be used. The protrusion may be a semi-circle, a rectangle, and the like. The dimensions may be nearly arbitrary, such as about 500 nanometers to about five millimeters.

Also in this embodiment, the protrusion of the mask is oriented away from the surface of conductive layer 402 by an application distance of about 150 microns. By so doing, a shadow effect causes the applied insulative layer 502 to cover a greater area than the area of the protrusion (and thus, the contact region has an area smaller than the protrusion). In this case, with the insulative material of insulative layer 502 being Al$_2$O$_3$ and deposited using a sputtering technique, the contact region is about 105 microns in width (shown left-to-right on the page) by about sixty microns in length (shown up-and-down on the page). The shadow effect's magnitude here is about forty-five microns. Thus, the protrusion is 150×150 microns but the contact region is 105×60 microns. This difference may be used to electrically isolate the contact region from later-deposited conductive layers, as will be described below.

Figure 6:
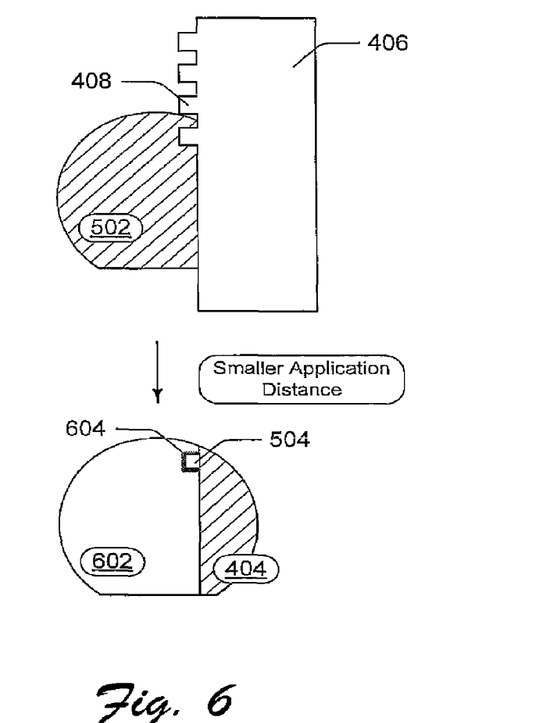
FIG. 6 illustrates the substrate of FIG. 5 after further processing.

Referring to FIG. 6, a nanometer-scale-thickness conductive layer 602 is applied over insulative layer 502 covered in part by the mask and at least one of the protrusions. This and other nanometer-scale-thickness conductive layers may comprise various materials and in various forms, with materials such as aluminum or gold, and with forms such as multi-layered layers of two or more materials. The protrusion is oriented effective to reduce the magnitude of the shadow effect present in the application of the layer 502 at FIG. 5. By reducing or eliminating the shadow effect, the protrusion may act to prevent the conductive layer 602 from coming into contact with the contact region of conductive layer 402.

In the illustrated embodiment, the protrusion and a zero application distance are effective to prevent the nanometer-scale-thickness conductive layer 602 from coming into contact with contact region 504. The protrusion, being 150×150 microns and with no application distance, is effective to prohibit conductive layer 602 from being applied to an insulative region 604 adjacent the contact region. The insulative region 604 and the contact region 504, with the conductive material of conductive layer 602 being aluminum and deposited using a sputtering technique, is about 150×150 microns. The insulative region 604 provides, on each of the three sides of the contact region 504, an insulative region of about 45 microns. This 45 microns is related to the difference between the contact region's dimensions and the protrusion's dimensions caused by the shadow effect at FIG. 5. The same mask and protrusion may be used in FIGS. 5 and 6.

Figure 7:
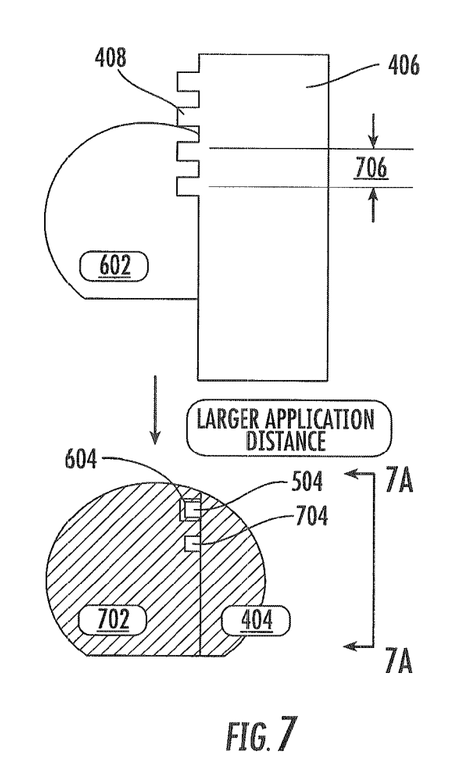
FIG. 7 illustrates the substrate of FIG. 6 after further processing.
Figure 7A:
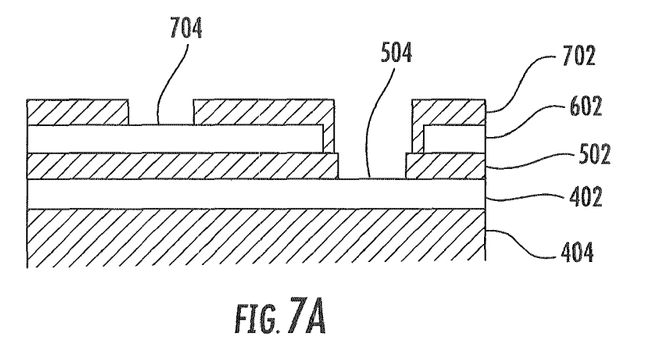
FIG. 7A it is a fragmentary sectional view of the substrate of FIG. 7 take along line 7A-7A.

Referring to FIG. 7, the mask is oriented effective to permit deposition of a nanometer-scale-thickness insulative layer 702 over conductive layer 602 while prohibiting all of contact region 504 to be covered. The mask may also be oriented effective to prevent application of the layer 702 over a second contact region 704 of conductive layer 602. Also, the mask may be oriented at an application distance such that a shadow effect causes the second contact region to be smaller in area than a protrusion of the mask. This shadow effect may be effective to enable coverage of insulative region 604, shown in FIG. 7 with a dashed-line box, with the insulative material of layer 702.

Transverse movement of a mask may be effective to create a pitch or spacing between contact regions. This pitch and spacing may be useful in enabling individual electrical connection to each contact region. The spacing may be nearly arbitrary, from sub-micrometers (e.g., nanometers) to millimeters in magnitude.

In the illustrated embodiment, the mask is moved down the page (transversely relative to the direction of application) and at an application distance (parallel relative to the direction of application). This transverse movement is equivalent to a pitch 706 of protrusions 408 of the mask 406. The application distance may be the same or similar to that previously used, in this case it is also 150 microns. With this exemplary mask, a second protrusion covers contact region 504 and the first protrusion covers second contact region 704. The application distance permits insulative layer 702 to cover at least conductive layer 602 near the insulative region 604, further protecting future electrical connection to the contact region from incidentally connecting to conductive layer 602. The application distance also permits a shadow effect capable of causing the second contact region to be smaller in area than the protrusion. The second contact region's area is related to the area of the protrusion of the mask and the application distance between the protrusion and the surface of conductive layer 602.

Figure 8:
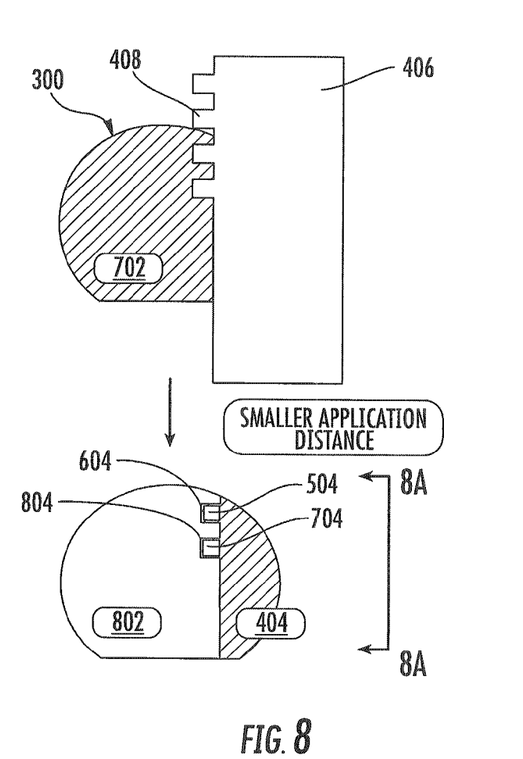
FIG. 8 illustrates the substrate of FIG. 7 after further processing.
Figure 8A:
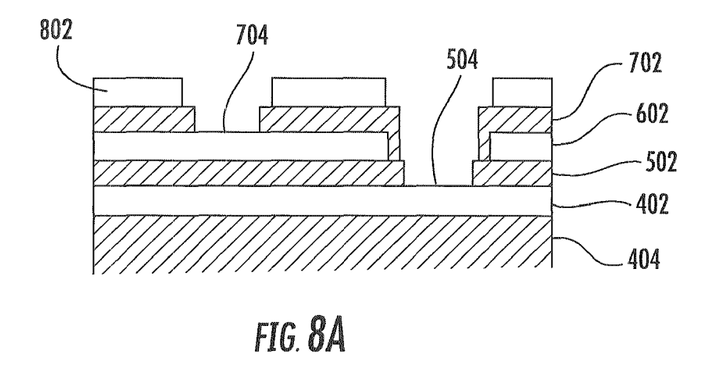
FIG. 8A it is a fragmentary sectional view of the substrate of FIG. 8 take along line 8A-8A.

Referring to FIG. 8, a nanometer-scale-thickness conductive layer 802 is applied over insulative layer 702 covered in part by the mask and at least two of the protrusions. The protrusions are oriented effective to reduce the magnitude of the shadow effect present in the application of the layer 702 at FIG. 7. By reducing or eliminating the shadow effect, the protrusion may act to prevent the conductive layer 802 from coming into contact with the contact regions 504 and 704.

In the illustrated embodiment, the protrusions and a zero application distance are used, which are effective to prevent the nanometer-scale-thickness conductive layer 802 from coming into contact with contact region 504 and second contact region 704. The protrusions, both being 150×150 microns and with no application distance, are effective to prohibit conductive layer 802 from being applied to the insulative region 604 and a second insulative region 804, which is adjacent the second contact region. The application may be performed similarly as described in relation to FIG. 6. The same mask and protrusion may be used in FIGS. 5, 6, 7, and 8.

In some embodiments, including the illustrated embodiment, the tools may be used to build large-scale contacts as part of a process also used to create the multilayer film. Thus, the large-scale contacts may be built coincident with applying layers with which the multilayer film is built. In the illustrated embodiment, processing of the multilayer film after creation of the film in order to build large-scale contacts is not needed, thereby potentially permitting relatively low fabrication costs. Also in the illustrated embodiment, no non-trivial processing need be used to build a multilayer film with large-scale contacts (outside of use of a mask as set forth herein) than that needed to build the multilayer film without such large-scale contacts.

The tools may be used to continue to build large-scale contacts enabling individual electrical connection to nanometer-scale-thickness layers of a multilayer film, such as by generally repeating the acts described in relation to FIGS. 7 and 8. The tools may do so to create tens, hundreds, or thousands of conductive nanometer-scale-thickness layers and large-scale contacts for individual connection to each.

Figure 9:
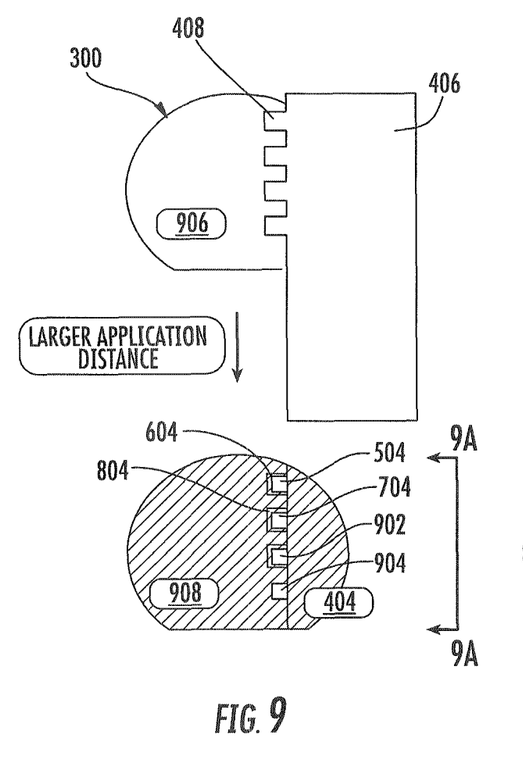
FIG. 9 illustrates the substrate of FIG. 8 after further processing.
Figure 9A:
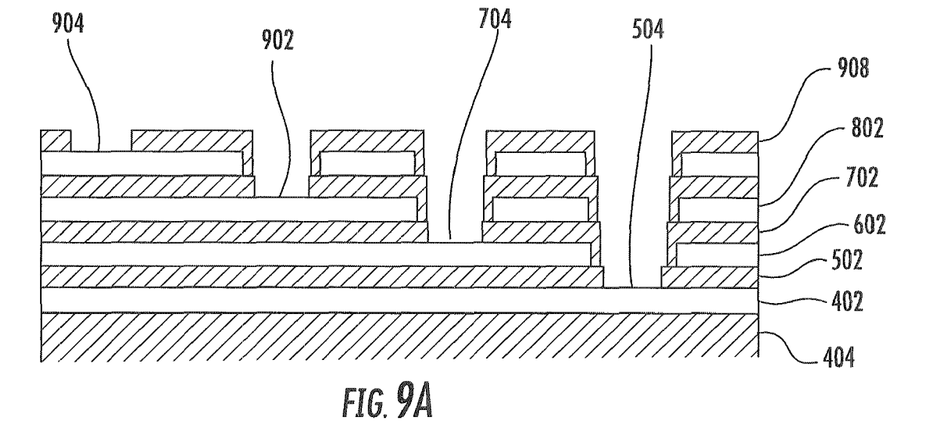
FIG. 9A it is a fragmentary sectional view of the substrate of FIG. 9 take along line 9A-9A.

Referring to FIG. 9, the tools continue to build large-scale contacts, building four contact regions (504, 704, 902, and 904) for four conductive nanometer-scale-thickness layers (402, 602, 802, and 906). The mask can continue to be oriented for creation of additional contact regions oriented along a row, shown like the four contact regions in FIG. 9 (showing also insulative nanometer-scale-thickness layer 908).

Figure 10:
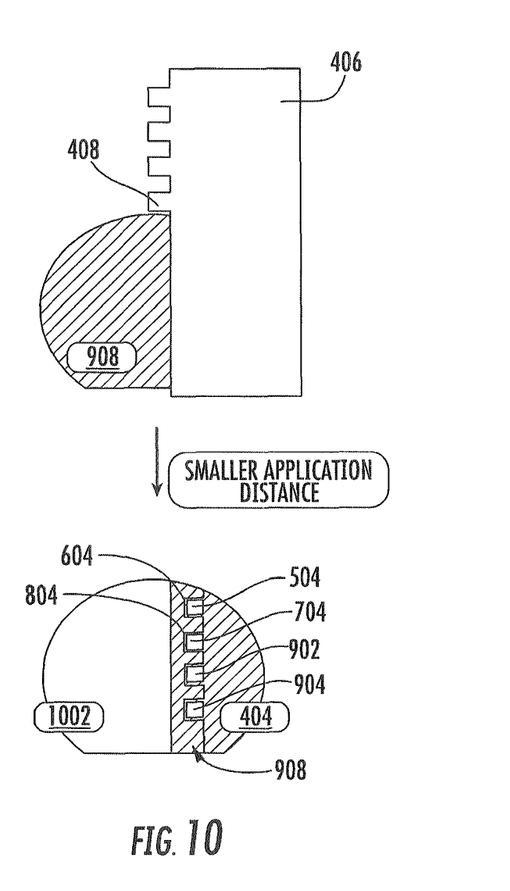
FIG. 10 illustrates the substrate of FIG. 9 after further processing.

The mask may also be oriented to build another row, the first act of which is shown in FIG. 10. Here the mask is oriented leftward (relative to the page), and a fifth conductive layer 1002 is shown applied. Repeating acts similarly to the acts described in relation to FIGS. 4, 5, 6, 7, and 8, the tools may be used to build another row of large-scale contact regions for additional conductive nanometer-scale-thickness layers.

Exemplary Multilayer Films With Large-Scale Contacts

An exemplary system comprising a multilayer film with large-scale contact regions is set forth below. It is provided as but one example of many systems capable of being fabricated using the tools.

Figure 11:
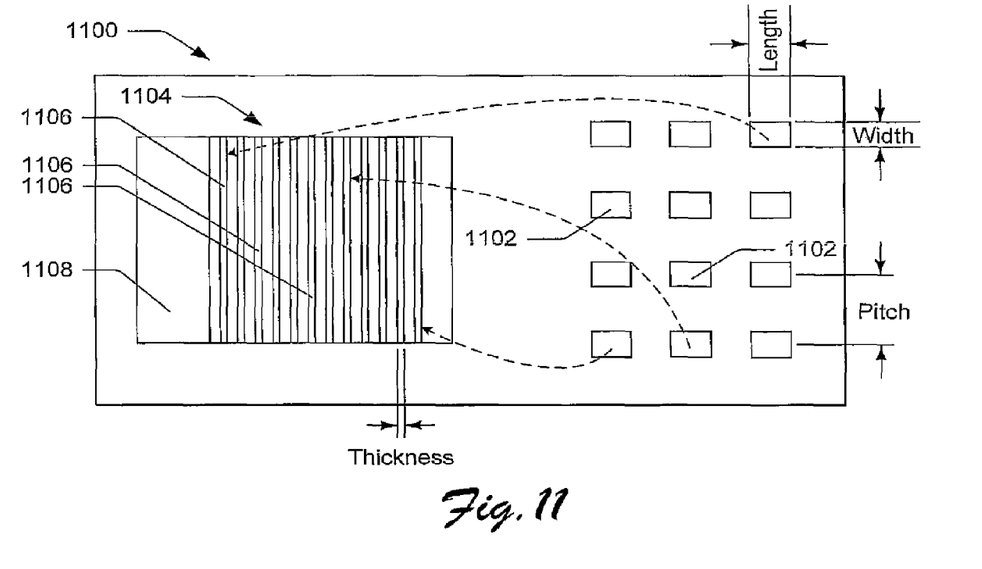
FIG. 11 illustrates an exemplary multilayer film and contact system having exemplary contact regions.

Referring to FIG. 11, an exemplary multilayer film and contact system 1100 is shown with an exemplary plurality of contact regions 1102 along with a cross-section of a multilayer film 1104 showing exposed edges of nanometer-scale-thickness conductive layers 1106. These nanometer-scale-thickness layers may, in some embodiments, correspond to nanometer-scale features, such as conductive structures (e.g., wires).

The system may be created generally as described in the illustrated embodiment for FIGS. 3-10 above, though with substrate 300 having a support structure 1108 to orient the layers. Thus, the tools may be used to deposit twenty-four layers (twelve of them conductive layers 1106) and with three rows of contact regions 1102 enabling individual electrical connection to each of the twelve conductive layers 1106.

Support structure 1108 enables the multilayer film to be applied with a geometry enabling its layers to be exposed in a plane about parallel to that in which the contact regions reside, though this is not necessary. Instead, for example, a cross-section of the substrate 300 and the multilayer film over the substrate (both of FIG. 9) may be cut, thereby creating exposed edges of the multilayer film about perpendicular to the exposed plane of the contact regions. In this system 1100, however, the layers are applied over the structure 1108 and then exposed in a plane about parallel to that of the area of the contact regions.

Figure 12:
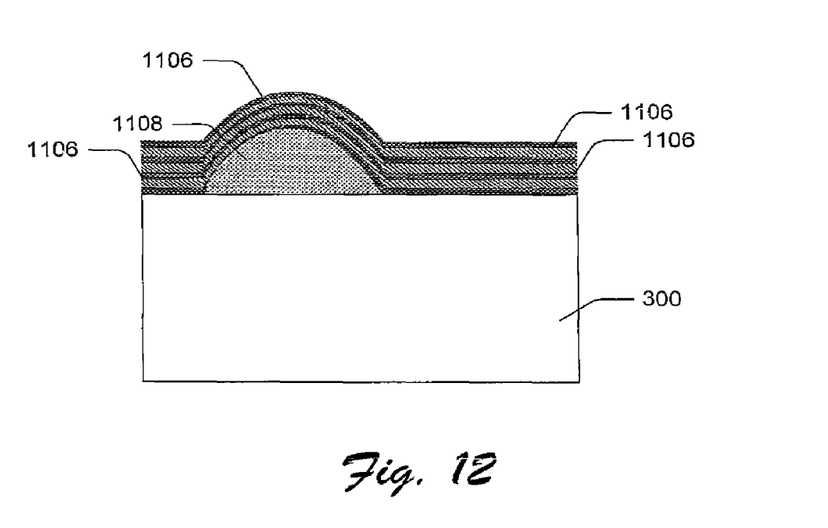
FIG. 12 illustrates a cross-section of three conductive layers applied over a support structure.

FIG. 12 illustrates a cross-section of three conductive layers applied over a support structure. FIG. 12 is provided to show a cross-section of a snap shot in time of layers applied over the support structure 1108 of system 1100. These layers are shown applied prior to applying all twelve conductive layers shown in FIG. 11. These layers are also shown without having been exposed as has been done with conductive layers 1106 of FIG. 11. These layers may later be exposed by various well-known techniques, such as by chemical mechanical polishing or planarization.

Each of contact regions 1102 individually enables electrical communication with one of nanometer-scale-thickness conductive layers 1106 (some communication shown with a dashed-line). In this embodiment, contact regions are shown with a width and length of 60 and 105 microns, respectively, marked at Width and Length in FIG. 11. A Pitch is also marked in FIG. 11, which here is 150 microns. With this width and pitch, a spacing between the contact regions is about 90 microns. The thickness (shown as Thickness in FIG. 11) of the layers 1106 is about twenty nanometers. Thus, each of the pitch, spacing, width, and length of the contact regions is one or more orders of magnitude greater than the thickness of the conductive layers.

Figure 13:
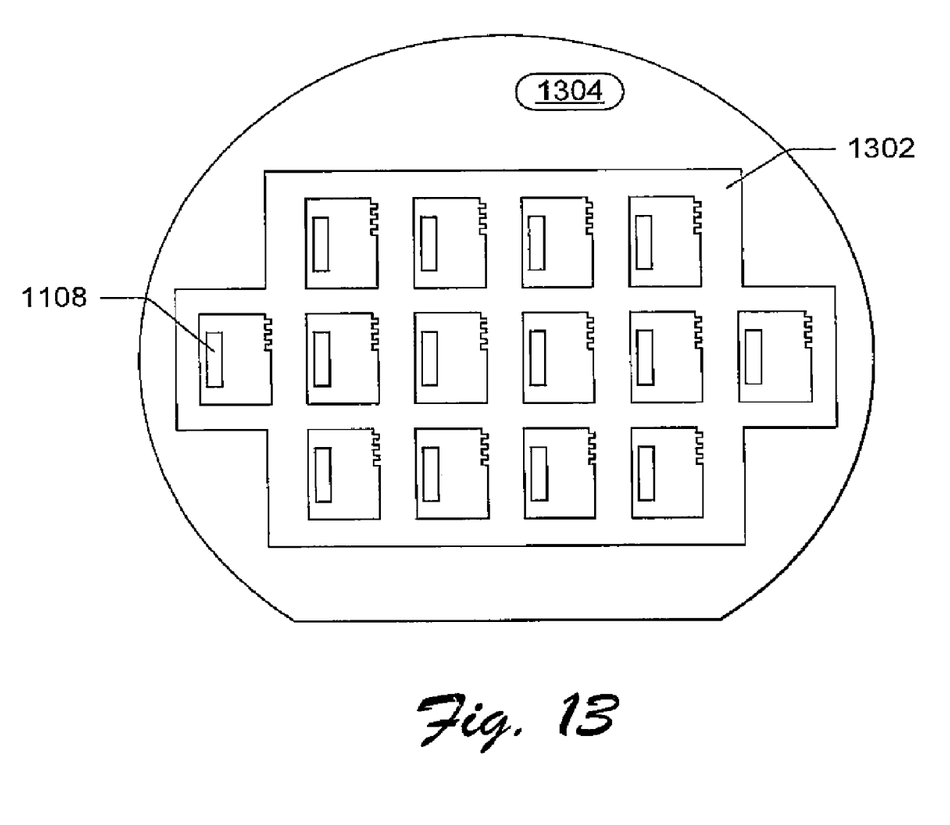
FIG. 13 illustrates an exemplary multi-system mask and substrate.

The tools may also be used to fabricate many nanometer-scale-thickness multilayer films having large-scale contacts for individual nanometer-scale-thickness layers of each film with a mask having protrusions. In FIG. 13, for instance, a multi-system mask 1302 is shown over a substrate 1304 having support structures 1108. By applying layers over substrate 1304, such as according to the acts related to FIGS. 3-10, the tools may be used to fabricate many films with large-scale contacts. As shown in FIG. 13, fourteen multilayer film and contact systems 1100 may be produced with a mask having protrusions for each system.

Although the invention is described in language specific to structural features and methodological steps, it is to be understood that the invention defined in the appended claims is not necessarily limited to the specific features or steps described. Rather, the specific features and steps disclosed represent preferred forms of implementing the claimed invention.

What is claimed is:

1. A multilayer film having multiple nanometer-scale-thickness conductive layers and multiple micrometer-or-larger-scale contact regions, each of the multiple micrometer-or-larger-scale contact regions enabling individual electrical communication with one of the multiple nanometer-scale-thickness conductive layers, wherein the multiple nanometer-scale-thickness conductive layers comprise a stack of at least about one hundred individual nanometer-scale-thickness conductive layers each individually having one of the multiple micrometer-or-larger-scale contact regions.

2. The multilayer film of claim 1, wherein the multiple micrometer-or-larger-scale contact regions are separated one from the other by at least about one micron.

3. The multilayer film of claim 1, further comprising multiple nanometer-scale-thickness insulative layers residing between the multiple nanometer-scale-thickness conductive layers.

4. The multilayer film of claim 1, wherein the multiple micrometer-or-larger-scale contact regions are oriented in multiple rows.

5. The multilayer film of claim 1, wherein the multilayer film resides over a support structure enabling exposure of edges of the multiple nanometer-scale-thickness conductive layers in a plane about parallel to a plane in which the multiple micrometer-or-larger-scale contact regions reside.

6. The multilayer film of claim 1, wherein each of the contact regions is exposed to provide the individual electrical communication with an external electrical conductor.

7. A multilayer film comprising:
a plurality of conductive layers, each conductive layer having an exposed edge having a thickness between about one and about 100 nanometers;
a plurality of insulative layers, each insulative layer having an exposed edge having a thickness between about one and about 500 nanometers; and
a plurality of contact regions, each contact region enabling individual electrical communication with one of the conductive layers and having an exposed area, each dimension of the exposed area being at least about an order of magnitude larger than the thickness of the exposed edge of the conductive layer with which the contact region enables electrical communication;
wherein the plurality of conductive layers have multiple nanometer-scale-thicknesses and form a stack of at least about one hundred individual nanometer-scale-thickness conductive layers each individually having one of the multiple micrometer-or-larger-scale contact regions.

8. The multilayer film of claim 7, wherein the exposed areas of the plurality of contact regions are separated one from the other by at least about one micron.

9. The multilayer film of claim 7, wherein the plurality of contact regions are oriented in a plurality of rows.

10. The multilayer film of claim 7, wherein the multiple micrometer-or-larger-scale contact regions are oriented in multiple rows.

11. The multilayer film of claim 7, wherein the multilayer film resides over a support structure enabling exposure of edges of the multiple nanometer-scale-thickness conductive layers in a plane about parallel to a plane in which the multiple micrometer-or-larger-scale contact regions reside.

12. The multilayer film of claim 7 wherein the exposed area of each contact region is configured to provide electrical communication with an external electrical conductor.

13. A multilayer film comprising:
a stack of at least tens of alternating electrically conductive layers and electrically insulative layers, wherein each electrically conductive layer has a contact region and a passage extending from the contact region through all the layers of the stack above the contact region;
wherein the stack having nanometer-scale-thickness conductive layers comprise at least a stack of tens of individual nanometer-scale-thickness conductive layers each individually having one of the micrometer-or-larger-scale contact regions.

14. The multilayer film of claim 13, wherein the electrically insulative layers line the passage to separate the electrically conductive layers above the contact region from the passage.

15. The multilayer film of claim 13, wherein the contact regions are micrometer or larger scale contact regions and wherein each of the electrically conductive layers has a nanometer-scale thickness.

16. The multilayer film of claim 15, wherein the micrometer-or-larger-scale contact regions are separated one from the other by at least about one micron.

17. The multilayer film of claim 15, wherein the multilayer film resides over a support structure enabling exposure of edges of the nanometer-scale-thickness conductive layers in a plane about parallel to a plane in which the micrometer-or-larger-scale contact regions reside.

18. The multilayer film of claim 13, wherein the contact region is exposed through the passage to allow individual electrical communication with external electrical conductors.

19. The multilayer film of claim 13, wherein the passage extends opposite to and across edges of a plurality of the electrically conductive layers and wherein the passage extends opposite to and across edges of a plurality of the insulative layers to allow electrical communication with the contact region through the passage.

* * * * *